United States Patent
Smith et al.

(10) Patent No.: US 11,013,157 B2
(45) Date of Patent: May 18, 2021

(54) ANTENNA SCREENING COMPOSITE, PANEL, ASSEMBLY, AND METHOD OF MANUFACTURING SAME

(71) Applicant: Solar Communications International, Inc., Temecula, CA (US)

(72) Inventors: Rodger Christin Smith, Temecula, CA (US); Efrain Alba, Pine Valley, CA (US); Robert Niedringhaus Renfro, San Diego, CA (US)

(73) Assignee: Solar Communications International, Inc., Temecula, CA (US)

( * ) Notice: Subject to any disclaimer, the term of this patent is extended or adjusted under 35 U.S.C. 154(b) by 0 days.

(21) Appl. No.: 16/796,792

(22) Filed: Feb. 20, 2020

(65) Prior Publication Data

US 2020/0296864 A1 Sep. 17, 2020

Related U.S. Application Data

(60) Provisional application No. 62/818,597, filed on Mar. 14, 2019.

(51) Int. Cl.
| | | |
|---|---|---|
| *H05K 9/00* | (2006.01) | |
| *B32B 27/12* | (2006.01) | |
| *B32B 27/08* | (2006.01) | |
| *B32B 5/26* | (2006.01) | |

(52) U.S. Cl.
CPC ............... *H05K 9/009* (2013.01); *B32B 5/26* (2013.01); *B32B 27/08* (2013.01); *B32B 27/12* (2013.01); *H05K 9/0088* (2013.01); *B32B 2262/101* (2013.01)

(58) Field of Classification Search
CPC ...... H05K 9/009; H05K 9/0088; B32B 27/12; B32B 27/08; B32B 5/26; B32B 2262/101; H01Q 1/42
See application file for complete search history.

(56) References Cited

U.S. PATENT DOCUMENTS

| | | | | |
|---|---|---|---|---|
| 4,554,204 A * | 11/1985 | Ono | ...................... | B29C 70/882 |
| | | | | 442/281 |
| 4,620,890 A * | 11/1986 | Myers | ..................... | B29C 70/34 |
| | | | | 156/196 |
| 5,408,244 A * | 4/1995 | Mackenzie | ............ | H01Q 1/422 |
| | | | | 343/872 |
| 6,441,799 B2 * | 8/2002 | Spaulding | .............. | H01Q 1/246 |
| | | | | 343/872 |
| 8,760,359 B2 * | 6/2014 | Sato | ....................... | H01Q 1/422 |
| | | | | 343/872 |
| 2011/0050511 A1 * | 3/2011 | Wang | ....................... | H01Q 9/42 |
| | | | | 343/702 |
| 2015/0322195 A1 * | 11/2015 | Makida | .................. | C08K 5/521 |
| | | | | 521/103 |

\* cited by examiner

*Primary Examiner* — Elizabeth C Imani
(74) *Attorney, Agent, or Firm* — Procopio Cory Hargreaves and Savitch LLP

(57) ABSTRACT

A antenna screening composite that mitigates or at least minimizes the need for special permitting of antenna screening panel construction comprises one or more fiberglass mats; one or more layers of polyester resin; one or more layers of woven robin; and one or more layers of one of bonded polyester fiber material and urethane foam.

17 Claims, 15 Drawing Sheets

ANTENNA SCREENING COMPOSITE, PANEL, ASSEMBLY, AND METHOD OF MANUFACTURING SAME

CROSS-REFERENCE TO RELATED APPLICATIONS

The application claims the benefit of U.S. provisional patent application No. 62/818,597, filed Mar. 14, 2019, under 35 U.S.C. 119, which is incorporated by reference herein.

FIELD OF THE INVENTION

The present invention relates to antenna screening panels for radio frequency ("RF") antennas.

BACKGROUND OF THE INVENTION

In the past, antenna screening panels have been problematic for code compliance authorities because of flammability and smoke issues. These antenna screening panels have required special consideration at variance with standards set by Universal Building Code ("UBC"), International Building Code ("IBC"), and other governing bodies.

SUMMARY OF THE INVENTION

An aspect of the invention involves a fire retardant antenna screening panel that mitigates or at least minimizes the need for special permitting of antenna screening panel construction. The fire retardant antenna screening panel is a microcell panel that provides structural strength and fire resistance heretofore not available in a screening panel for radio antenna concealment. The fire retardant antenna screening panel also meets fire codes not attainable by the prior art. This enables the fire retardant antenna screening panel to be allowed to be placed on a property line per IBC code and used as "wall mounted" panels on many building types.

Another aspect of the invention involves an antenna screening composite comprising one or more fiberglass mats; one or more layers of polyester resin; one or more layers of woven robin; and one or more layers of one of bonded polyester fiber material and urethane foam.

One or more implementations of the aspect of the invention described immediately above includes one or more of the following the one or more fiberglass mats include a first fiberglass mat, a second fiberglass mat, and a third fiberglass mat; the one or more layers of polyester resin include a first layer of polyester resin, a second layer of polyester resin, a third layer of polyester resin, a fourth layer of polyester resin, and a fifth layer of polyester resin; the one or more layers of woven robin include a single layer of woven robin; the one or more layers of one of bonded polyester fiber material and urethane foam include one or more layers of urethane foam; the one or more layers of urethane foam include a single layer of urethane foam; the one or more layers of one of bonded polyester fiber material and urethane foam include a bonded polyester fiber material including a porosity that improves absorption of fire retardant material into the antenna screening composite; the bonded polyester fiber material includes a dry weight greater than 110 g/m2, 3.24 oz/sqy and less than 185 g/m2, 5.44 oz/sqy; the bonded polyester fiber material includes a dry thickness that is greater than 3 mm, 118 mils and less than 5 mm, 197 mils; the bonded polyester fiber material includes a resin impregnated thickness that is greater than 2.9 mm, 114 mils and less than 4.9 mm, 193 mils; the bonded polyester fiber material includes an impregnated specific weight (density) that is less than 0.66 g/cm$^3$, 0.024 lb/in$^3$ and greater than 0.65 g/cm$^3$, 0.023 lb/in$^3$ Y; the bonded polyester fiber material includes a resin consumption that is greater than 1.8 kg/m$^2$, 3.3 lbs/sqy and less than 3.0 kg/m$^2$, 5.5 lbs/sqy; the antenna screening composite includes a Flame Spread Index of 20; the antenna screening composite includes a NFPA 268 Certification/ASTM E-84 & ASTM E2768-11 (Extended Duration Surface Burn) with a flame spread index of 25 or less for a 10 min. period; and/or the antenna screening composite includes a flame front that does not progress more than 10.5 ft/3.2 m beyond centerline of burners at any time during 30 min. period.

A further aspect of the invention involves a method of manufacturing the antenna screening composite of the aspect of the invention described above, and the method comprising blending fire retardant resin by blending together the following three sub components: 1) resin base, 2) promoter, and 3) methyl ethyl ketone peroxide (MEKP9).

One or more implementations of the aspect of the invention described immediately above includes one or more of the following: a promoting step, canalization step, and a layup step with the antenna screening composite; a post-curing step with the antenna screening composite; the post-curing step is performed at 180-210 degrees Fahrenheit and includes ramping the temperature without exceeding 5 degrees increase in temperature per minute; and/or the antenna screening composite includes 37.5% glass percentage and 62.5% resin content.

BRIEF DESCRIPTION OF DRAWINGS

The accompanying drawings, which are incorporated in and form a part of this specification illustrate embodiments of the invention and together with the description, serve to explain the principles of the invention.

DESCRIPTION OF EMBODIMENT OF THE INVENTION

Figure 1:
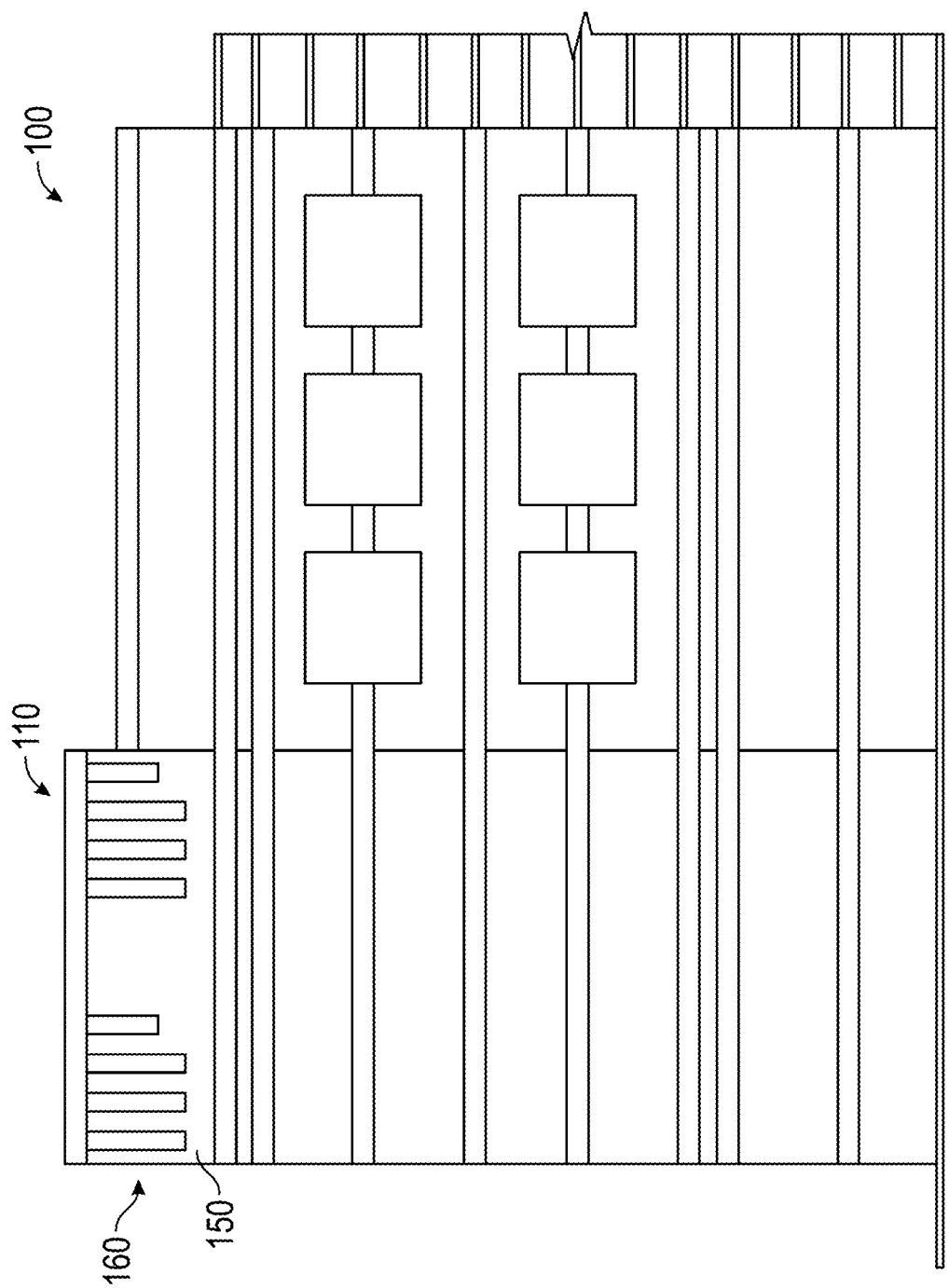
FIG. 1 is a front-elevational view of a building in which antenna screening panels for RF antennas accordingly to an embodiment of the invention may be applied.
Figure 2:
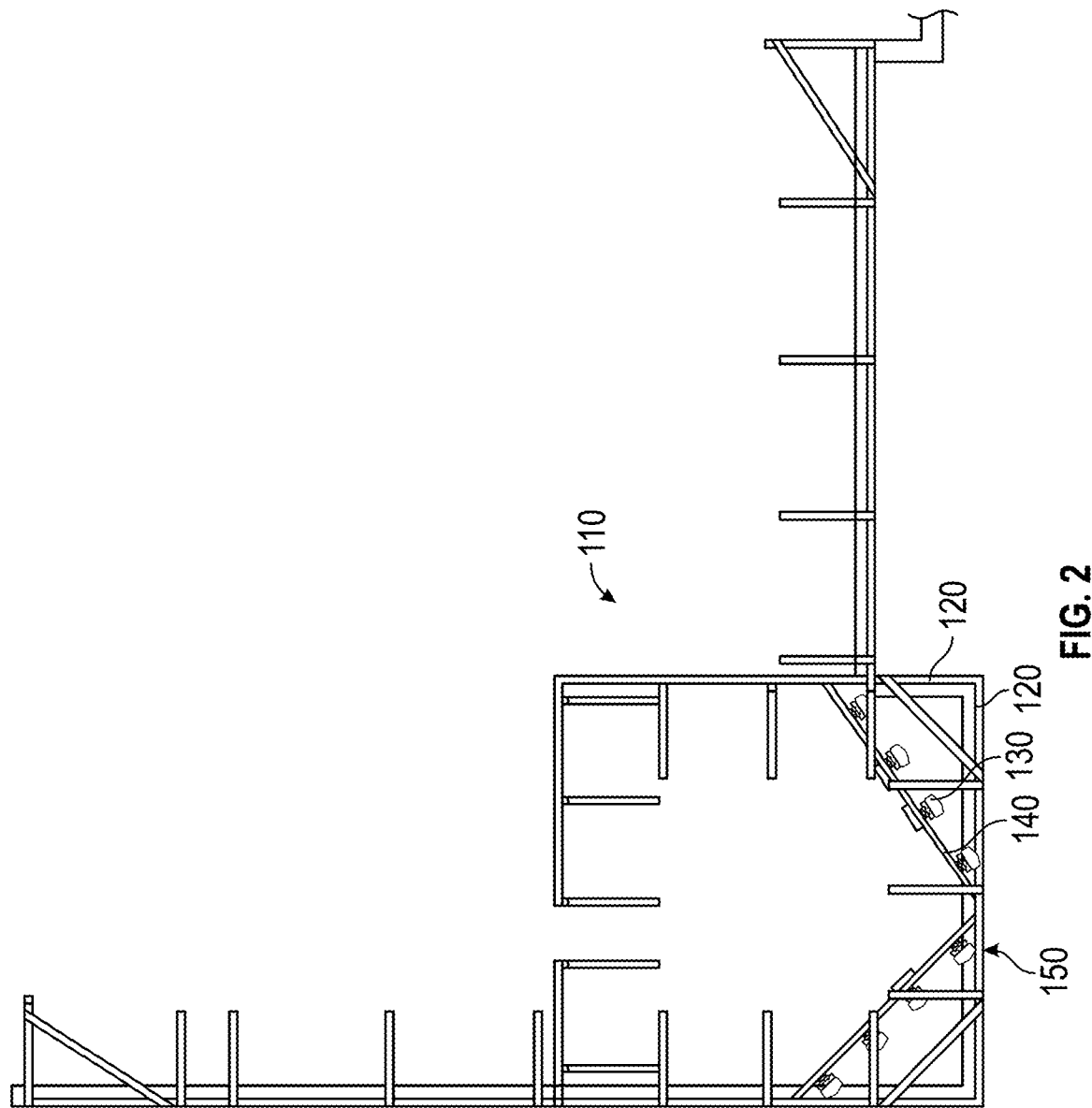
FIG. 2 is a top cross-sectional view of the antenna screening panels for RF antennas for the building shown in FIG. 1.
Figure 3:
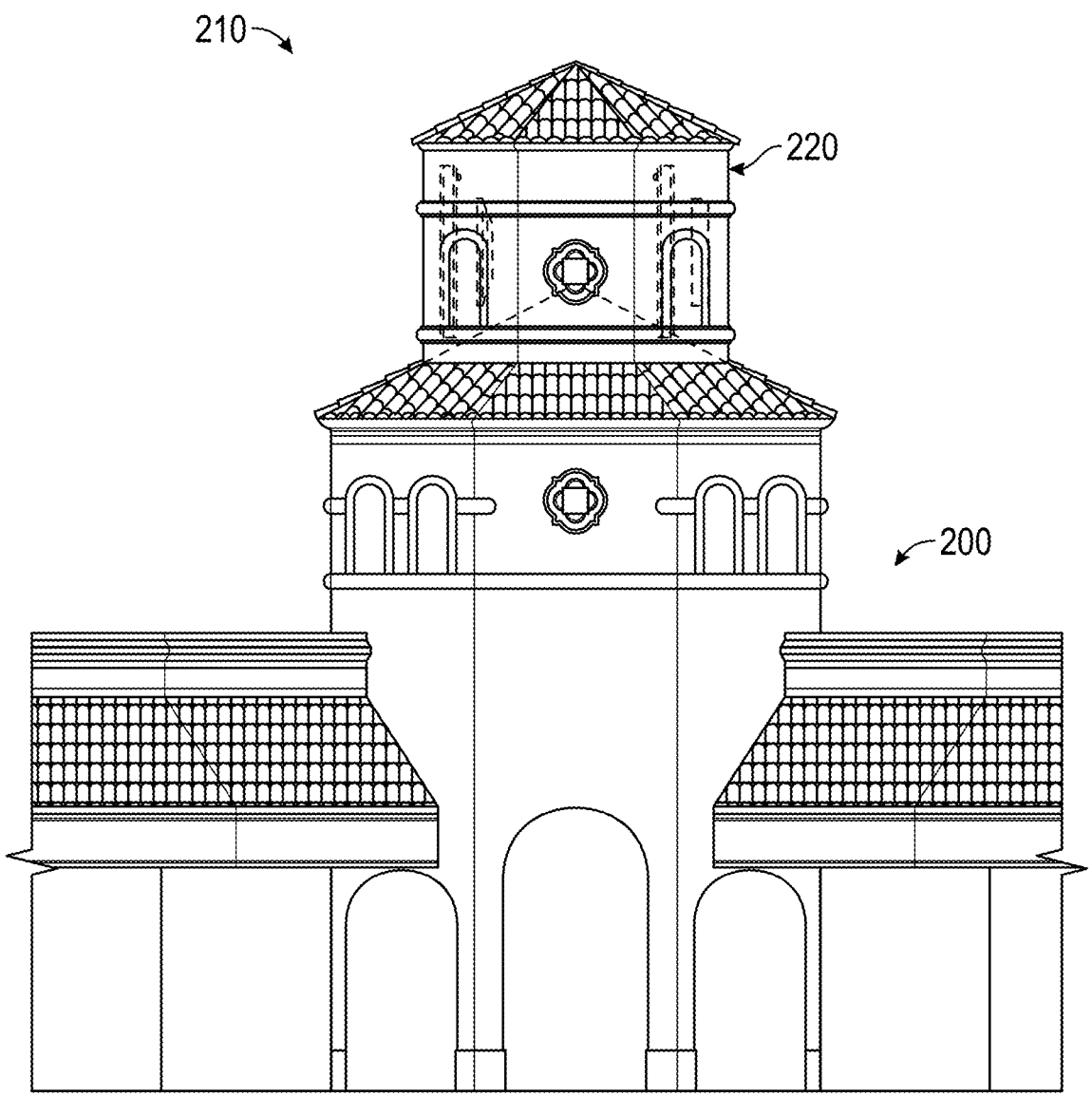
FIG. 3 is a front-elevational view of another building in which the antenna screening panels for RF antennas according to an embodiment of the invention may be applied.
Figure 4:
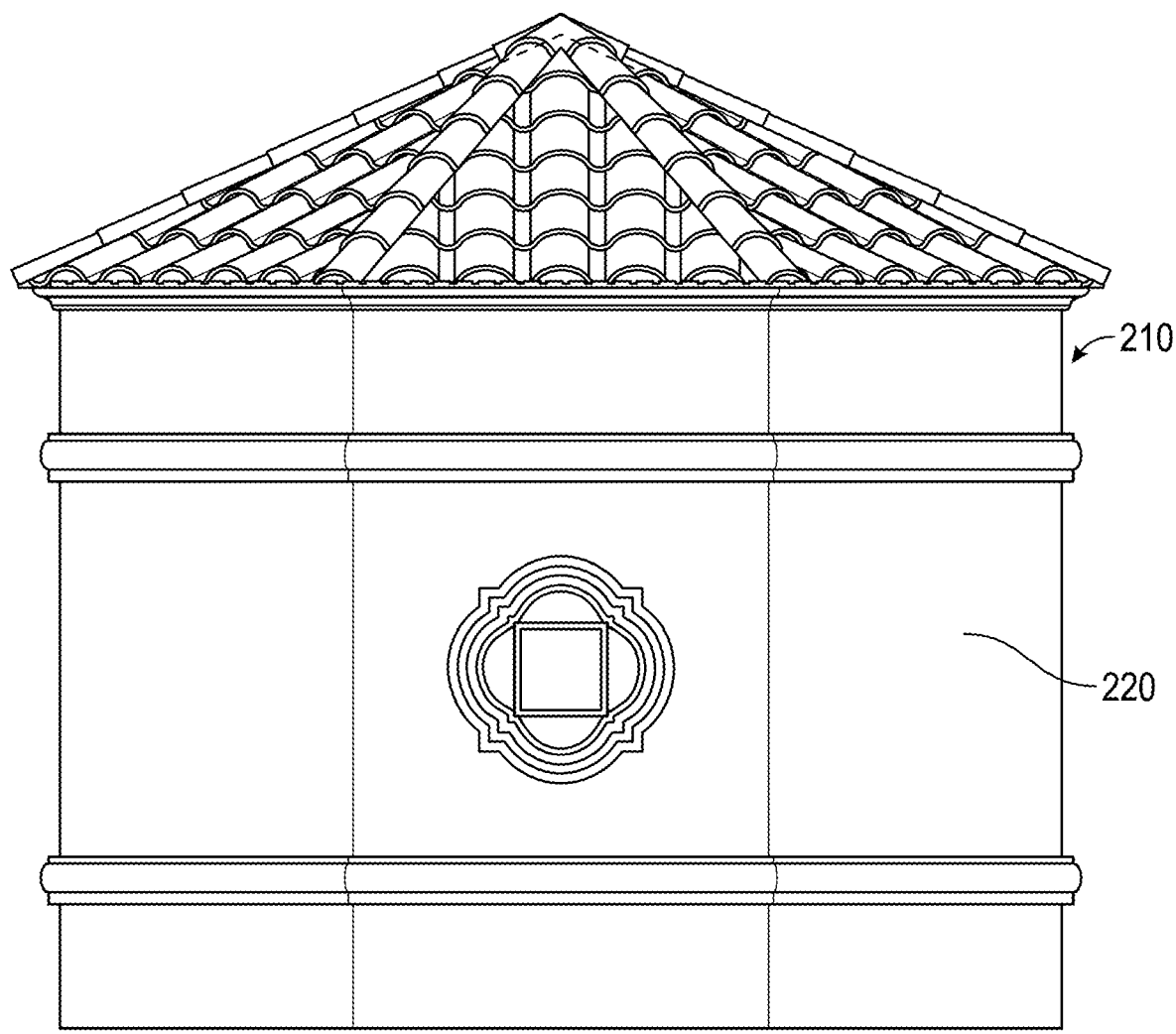
FIG. 4 is a front-elevational view of a section of the building of FIG. 3 made of the antenna screening panels for RF antennas.
Figure 5:
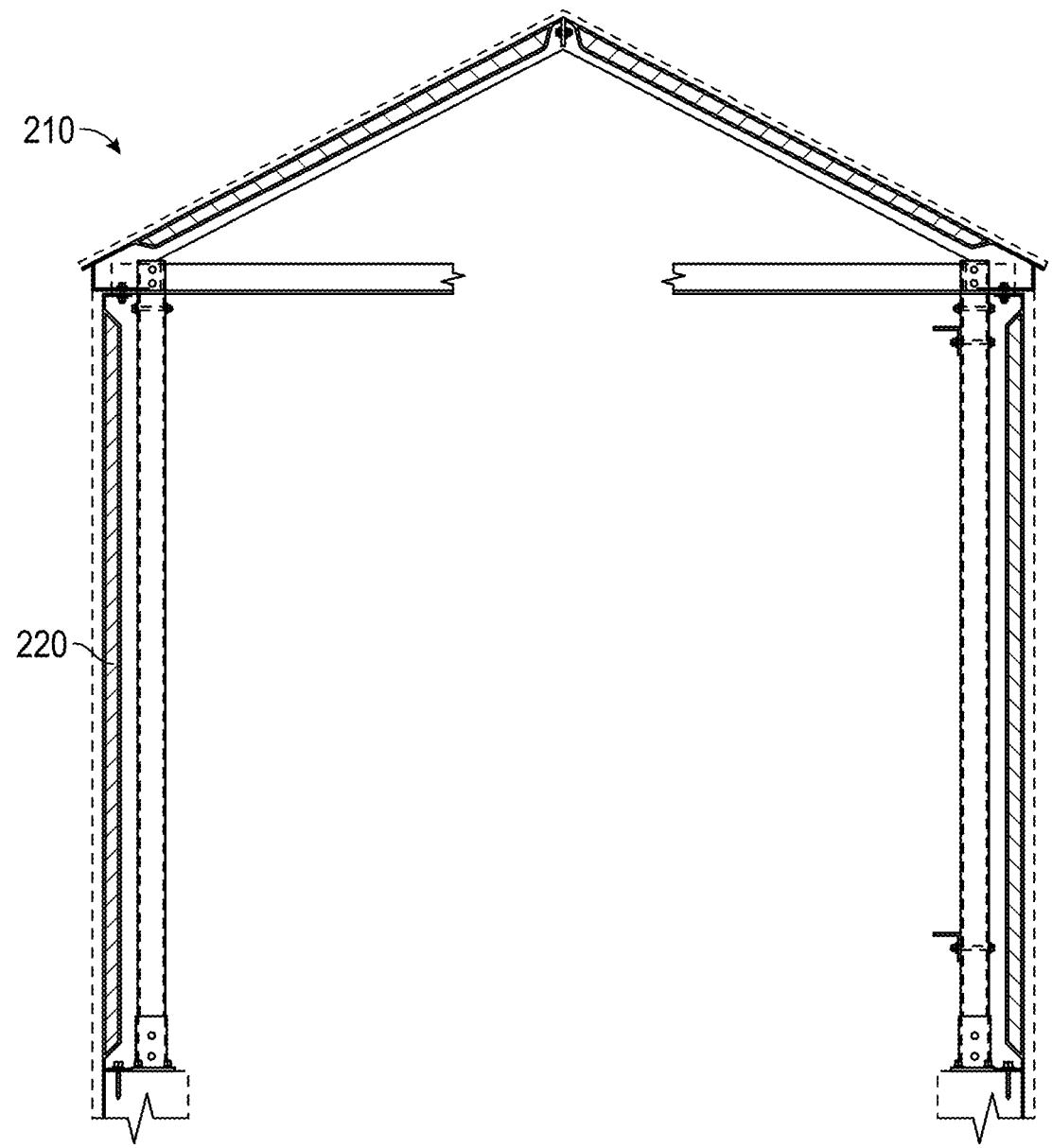
FIG. 5 is a front cross-sectional view of the section of the building of FIG. 4 made of the antenna screening panels for RF antennas.
Figure 6:
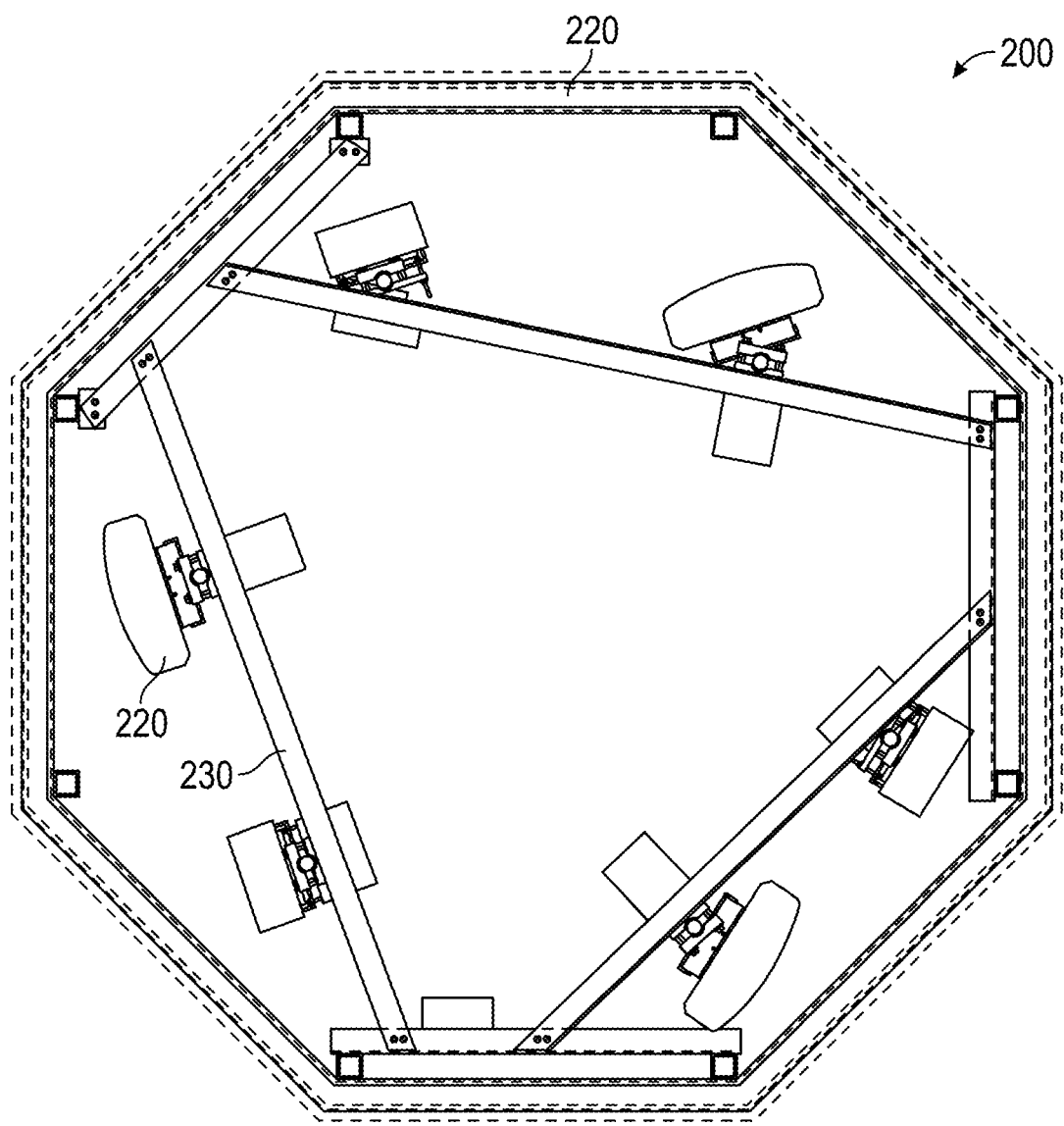
FIG. 6 is a top cross-sectional view of the section of the building of FIG. 4 made of the antenna screening panels for RF antennas.

With reference to FIGS. 1 and 2, an embodiment of a building 100 in which antenna screening panels for RF antennas accordingly to an embodiment of the invention may be applied is shown. The building 100 includes a rooftop communication antenna screening section 110 made of RF transparent antenna screening panel assemblies 120. RF antennas 130 are carried by antenna structural supports (e.g., pultruded fiberglass reinforced structure supports) 140. Because of the fire-retardant qualities of the antenna screening panel assemblies 120, the antenna screening panel assemblies 120 may be disposed along property lines/edges 150 of a top 160 of the building 100 instead of having to be set back a certain distance from the property lines/edges 150. This allows the RF antennas 130 to be disposed closer to the edges 150 of the building (e.g., placed on a property line per IBC code and used as "wall mounted" panels on many building types), which allows the RF antennas 130 to broadcast RF signals more downward without being blocked by a top 160 of the building adjacent to the edges 150.

FIGS. 3-6 shown another embodiment of a building 200 in which antenna screening panels for RF antennas accordingly to an embodiment of the invention may be applied is shown. The building 200 includes a rooftop communication antenna screening section 210 made of antenna screening panel assemblies 220. RF antennas 230 are carried by antenna structural supports (e.g., pultruded fiberglass reinforced structure supports) 240.

Figure 7:
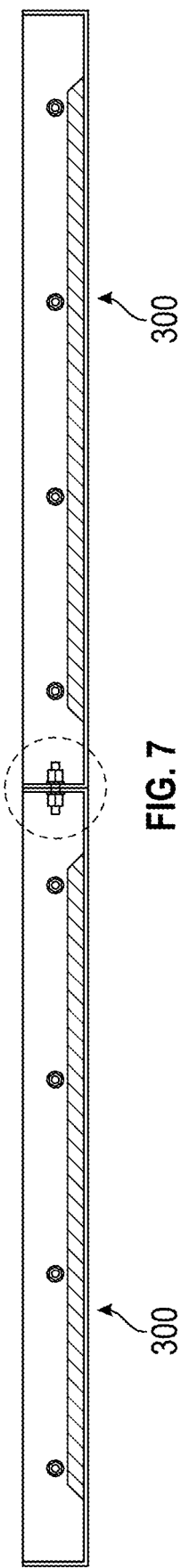
FIG. 7 is a cross-sectional view of a pair of antenna screening panel assemblies for RF antennas coupled together side-to-side.
Figure 8:
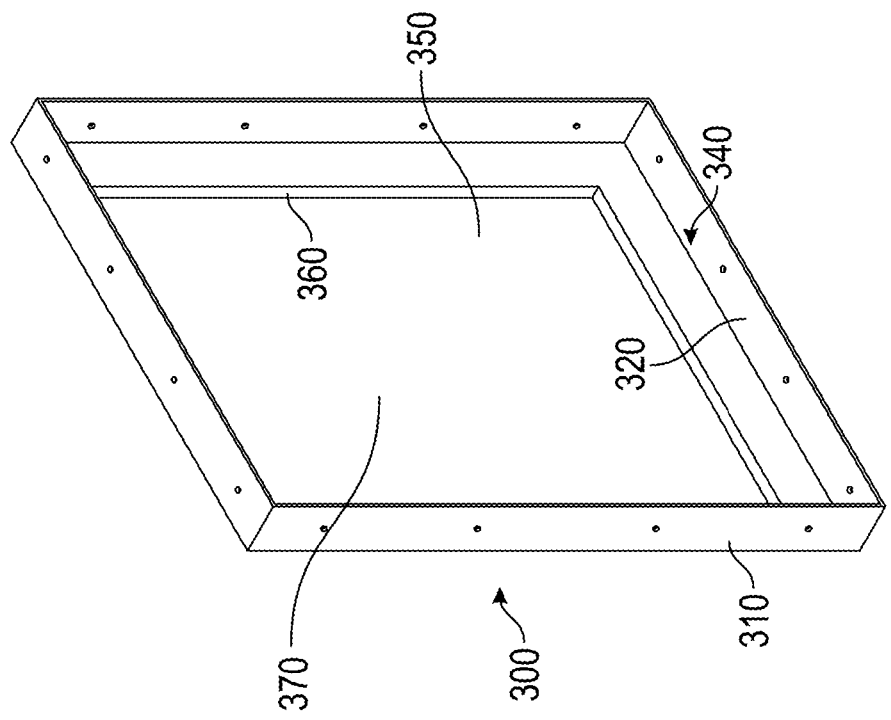
FIG. 8 is perspective view of one of the antenna screening panel assemblies for RF antennas of FIG. 7.
Figure 10:
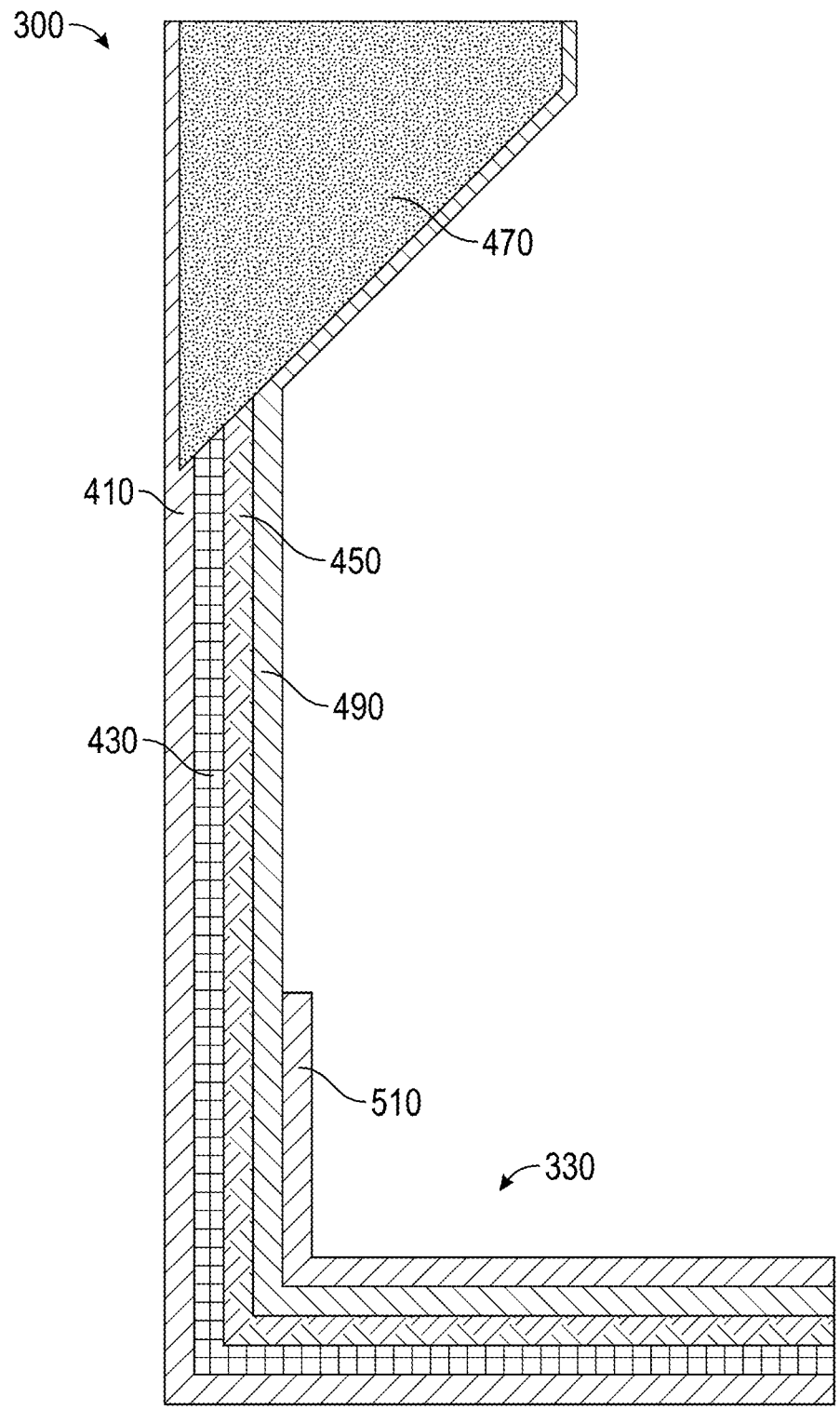
FIG. 10 is a cross-sectional view of a portion of one of the antenna screening panel assemblies for RF antennas of FIG. 7.

With reference to FIGS. 7, 8, and 10, an embodiment of an antenna screening panel assembly 300 for RF antennas will be described. The antenna screening panel assembly 300 includes panel walls 310, 320, flange (e.g., fiberglass structural flange(s)) 330 adjacent to interior corner 340, and raised interior section 350. The raised interior section 350 includes inclined sections 360 and raised flat section 370. The panel assemblies 300 may be connected side-to-side, as shown in FIG. 7, or end-to-end via fasteners 390 (e.g., rods with hex nuts).

Figure 9:
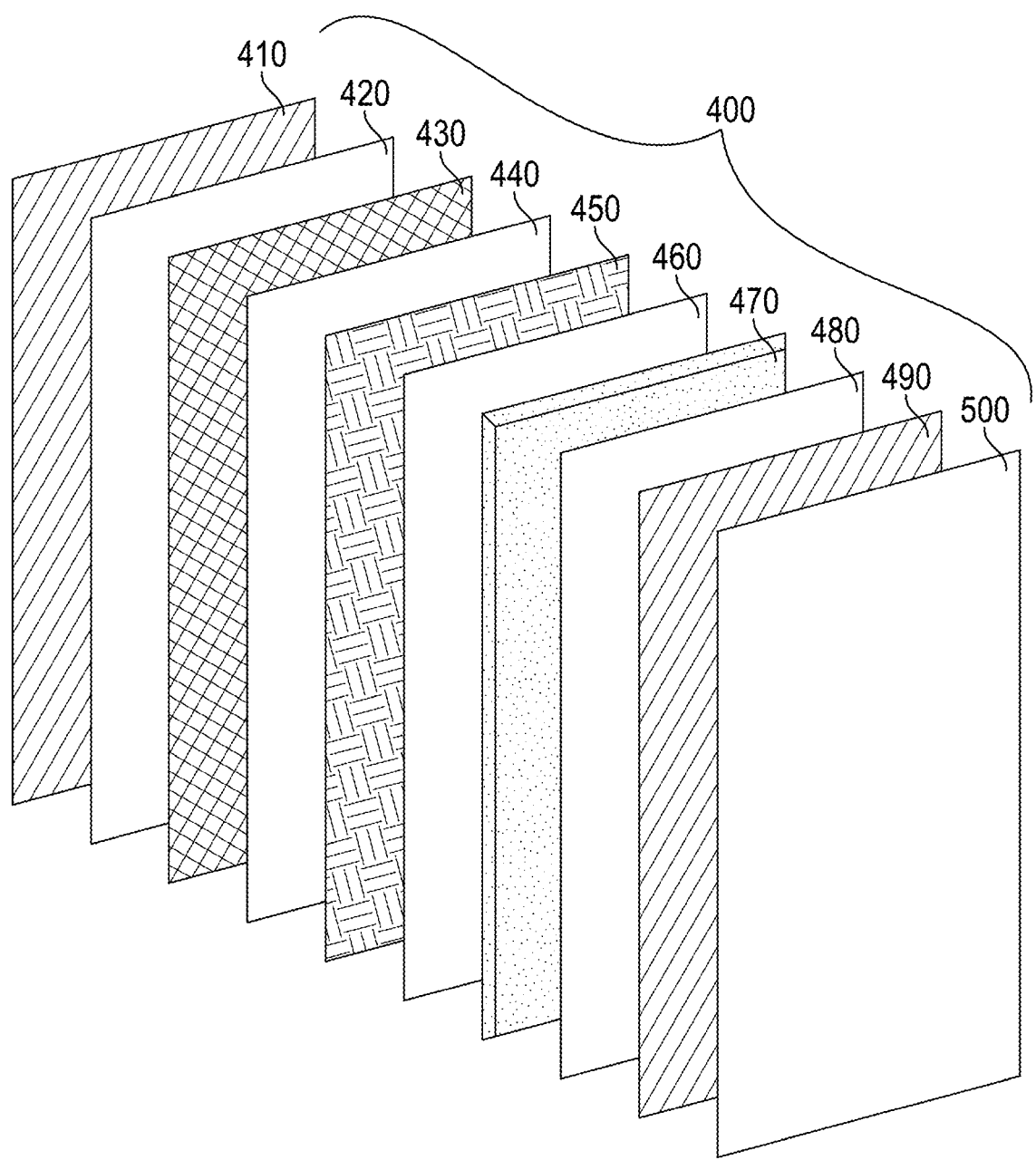
FIG. 9 is an exploded view of an embodiment of an antenna screening panel and shows the materials that make up the antenna screening panel.

With reference to FIGS. 9 and 10, an antenna screening panel/composite 400 that the panel walls 310, 320 may be comprised of includes, from left-to-right, the antenna screening panel 400 having a first fiberglass mat 410, a first layer of polyester resin 420, a second fiberglass mat 430, a second layer of polyester resin 440, a layer of woven robin 450, a third layer of polyester resin 460, a layer of urethane foam 470, a fourth layer of polyester resin 480, a third layer of fiberglass mat 490, and a fifth layer of polyester resin 500. Additionally, an extra layer of fiberglass mat 510 may be added for flanges of the assembly 300.

Figure 11:
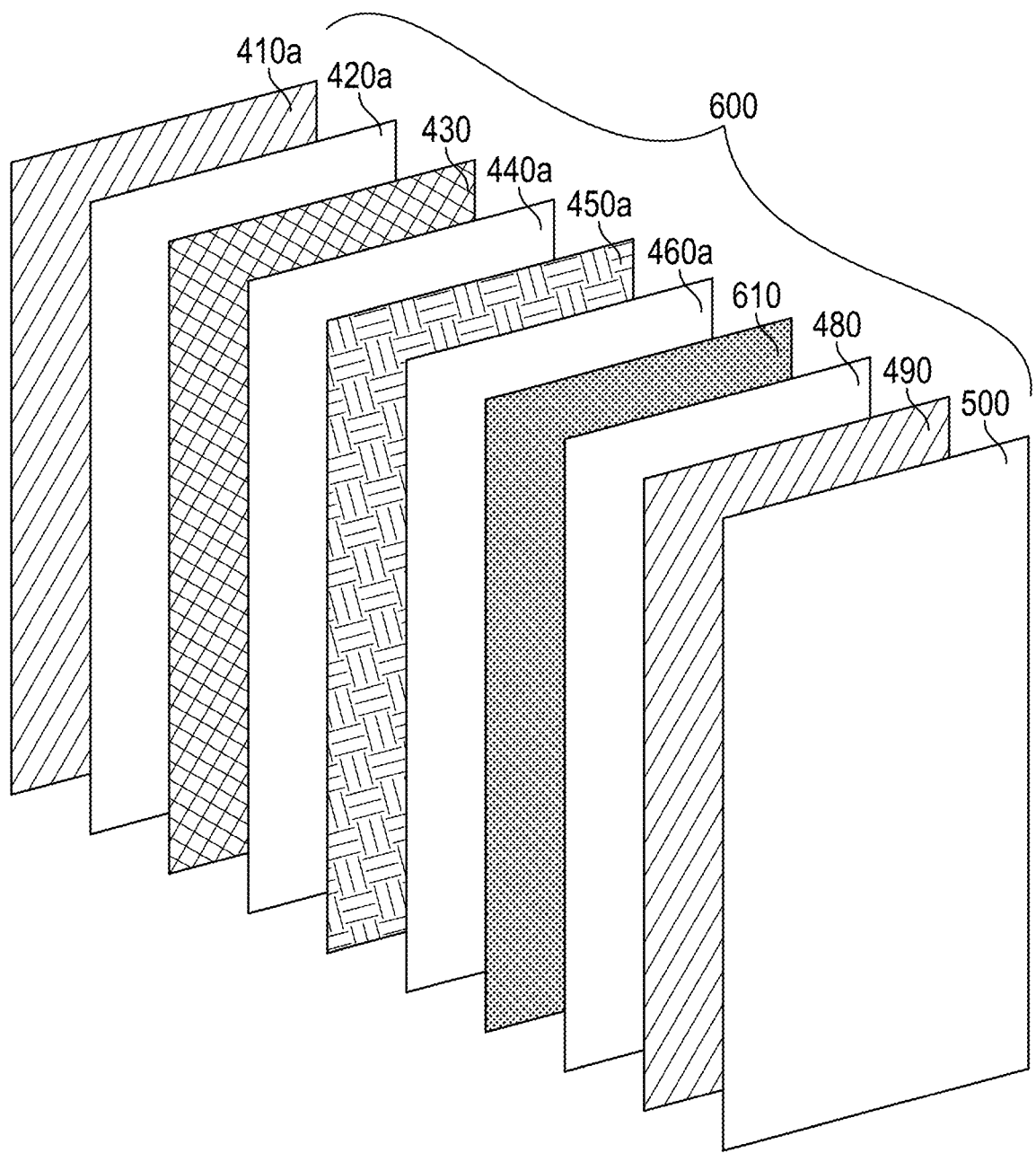
FIG. 11 is an exploded view of another embodiment of an antenna screening panel and shows the materials that make up the antenna screening panel.
Figure 12:
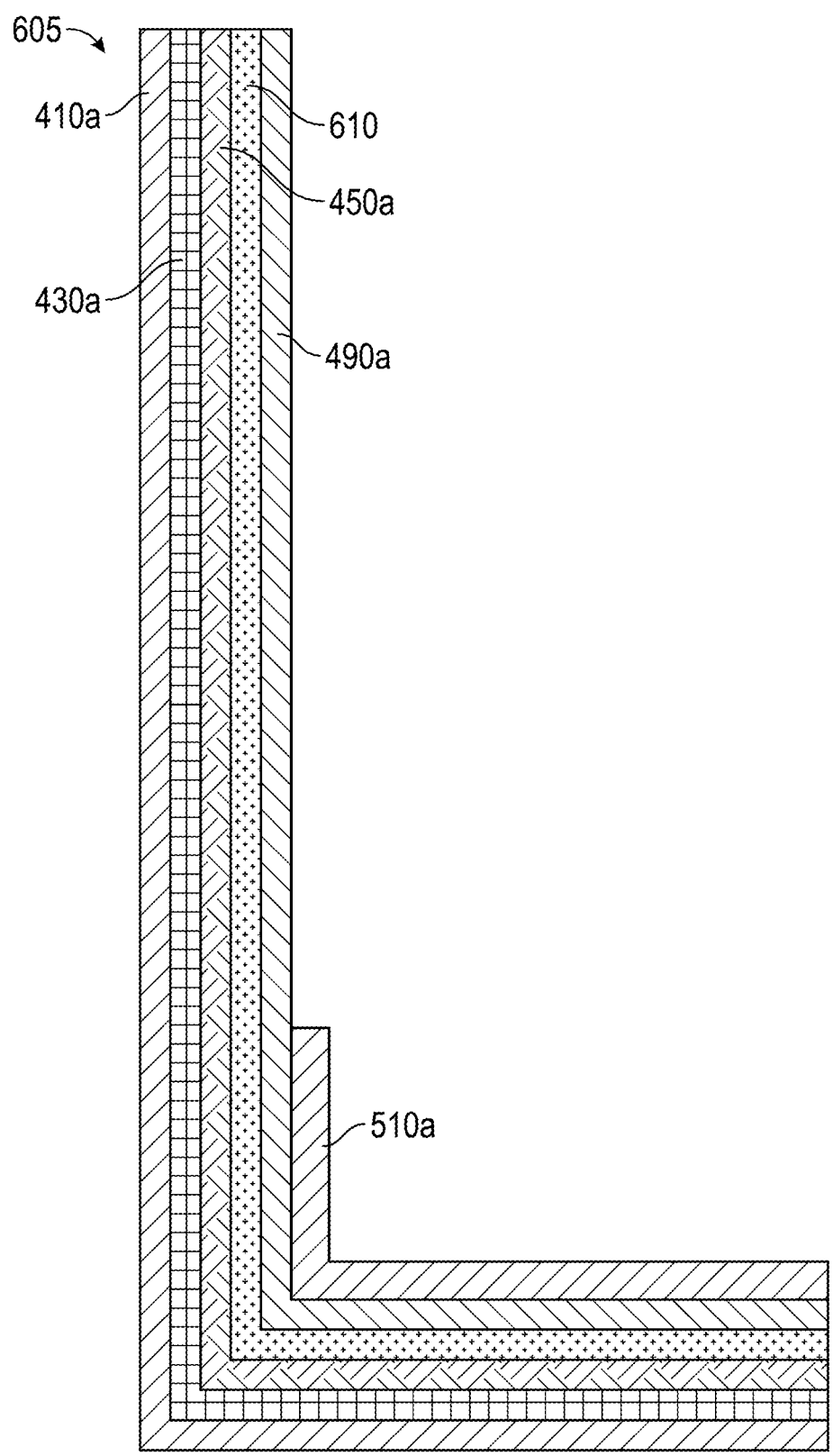
FIG. 12 is a cross-sectional view of a portion of a further embodiment of an antenna screening panel assembly.

FIGS. 11 and 12 illustrate another embodiment of an antenna screening panel/composite 600/assembly 605 and shows the materials that make up the antenna screening panel 600 Like elements to those shown and described previously are shown and/or described with the same reference number, but with an "a" suffix. Instead of the layer of urethane foam layer 470 shown in FIG. 9, the antenna screening panel/composite 600 includes a layer of Coremat® (or equivalent) bonded polyester fiber material ("BPFM") 610. Coremat® comes is rolls of bonded polyester fibers with a styrene soluble binder and expanded foam—intended for use as an interlayer in glass reinforced plastic construction, and is a registered trademark of Lantor B.V. of the Netherlands. Below is a chart of technical data for different types of BPFM.

| BPFM Technical Data | | BPFM 1 | BPFM 2 | BPFM3 | BPFM 4 | BPFM 5 |
|---|---|---|---|---|---|---|
| Dry Weight | g/m2 | 55 | 70 | 110 | 140 | 185 |
| | oz/sqy | 1.61 | 2.06 | 3.24 | 4.13 | 5.44 |
| Dry Thickness | mm | 1.4 | 2 | 3 | 4 | 5 |
| | mils | 55 | 79 | 118 | 158 | 197 |
| Resin Impregnated Thickness | mm | 1.3 | 1.9 | 2.9 | 3.9 | 4.9 |
| | mils | 55 | 75 | 114 | 154 | 193 |
| Roll length | m | 100 | 80 | 50 | 40 | 30 |
| | ft | 328.08 | 262.47 | 164.04 | 131.23 | 98.43 |
| Roll Width | cm | 100 | 100 | 100 | 100 | 100 |
| | inch | 39.4 | 39.4 | 39.4 | 39.4 | 39.4 |
| Impregnated Specific Weight (Density) | g/cm$^3$ | 0.81 | 0.67 | 0.66 | 0.65 | 0.65 |
| | lb/in$^3$ | 0.029 | 0.024 | 0.024 | 0.024 | 0.023 |
| Resin Consumption | kg/m$^2$ | 1 | 1.2 | 1.8 | 2.4 | 3.0 |
| | lbs/sqy | 1.83 | 2.2 | 3.3 | 4.5 | 5.5 |

It has been determined that BPFM 4 in the above chart is the preferred embodiment of BPFM. Thus, the BPFM preferably has dry weight greater than 110 g/m2, 3.24 oz/sqy and less than 185 g/m2, 5.44 oz/sqy, a dry thickness that is greater than 3 mm, 118 mils and less than 5 mm, 197 mils, a resin impregnated thickness that is greater than 2.9 mm, 114 mils and less than 4.9 mm, 193 mils, a roll length that is less than 50 m, 164.04 ft and greater than 30 m, 98.43 ft, an impregnated specific weight (density) that is less than 0.66 g/cm$^3$, 0.024 lb/in$^3$ and greater than 0.65 g/cm$^3$, 0.023 lb/in$^3$ Y, and/or a resin consumption that is greater than 1.8 kg/m$^2$, 3.3 lbs/sqy and less than 3.0 kg/m$^2$, 5.5 lbs/sqy.

The Coremat® (or equivalent) BPFM 610 includes a porosity that improves absorption of the fire retardant material into the antenna screening panel/composite 600/assembly 605, enhancing the fire retardant characteristics of the panel/composite 600/assembly 605. The addition of the Coremat® BPFM 610 also improves production of the panel/composite 600/assembly 605; application and dry time is quicker and covers more surface area of the panel/composite 600/assembly 605.

Figure 13:
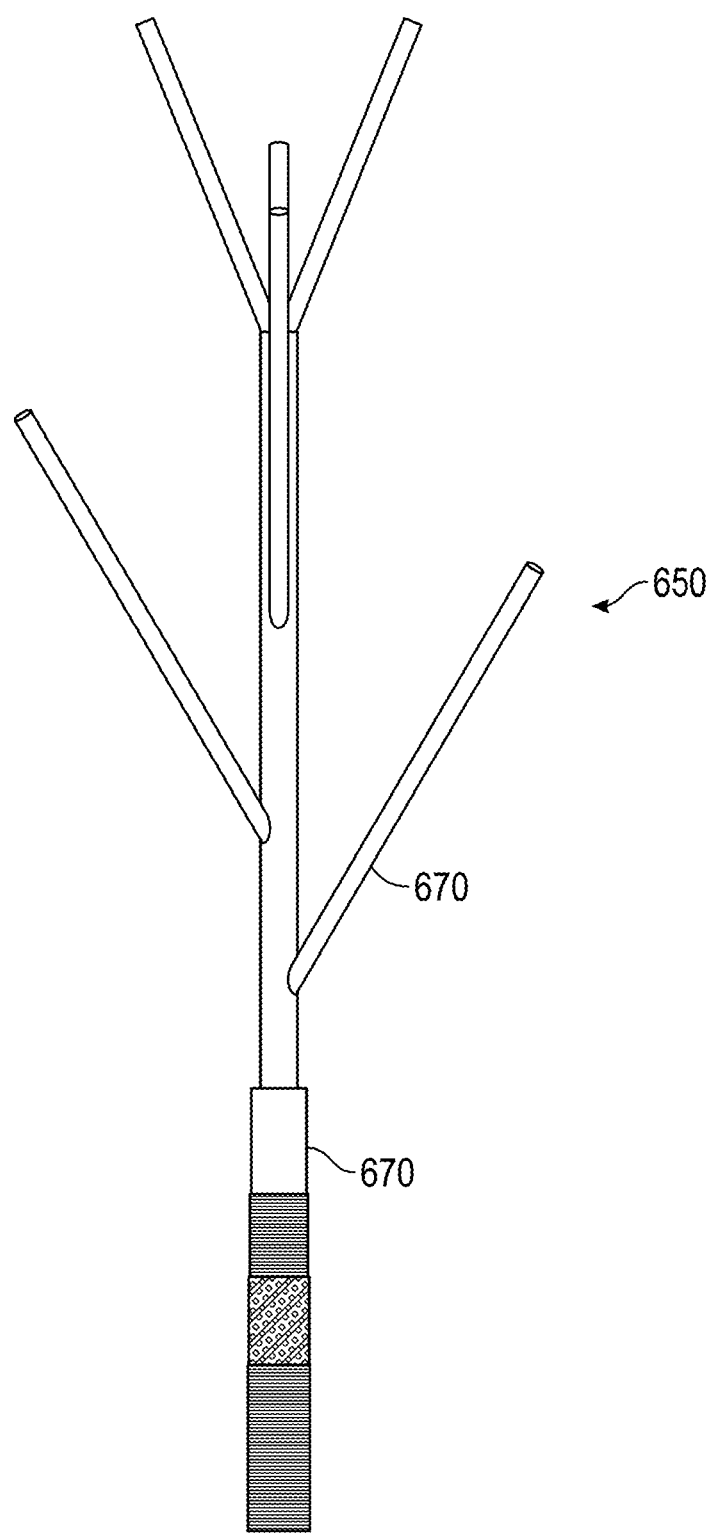
FIG. 13 is a front-elevational view of an embodiment of a fire-retardant eucalyptus branch used to conceal one or more RF antennas.
Figure 14:
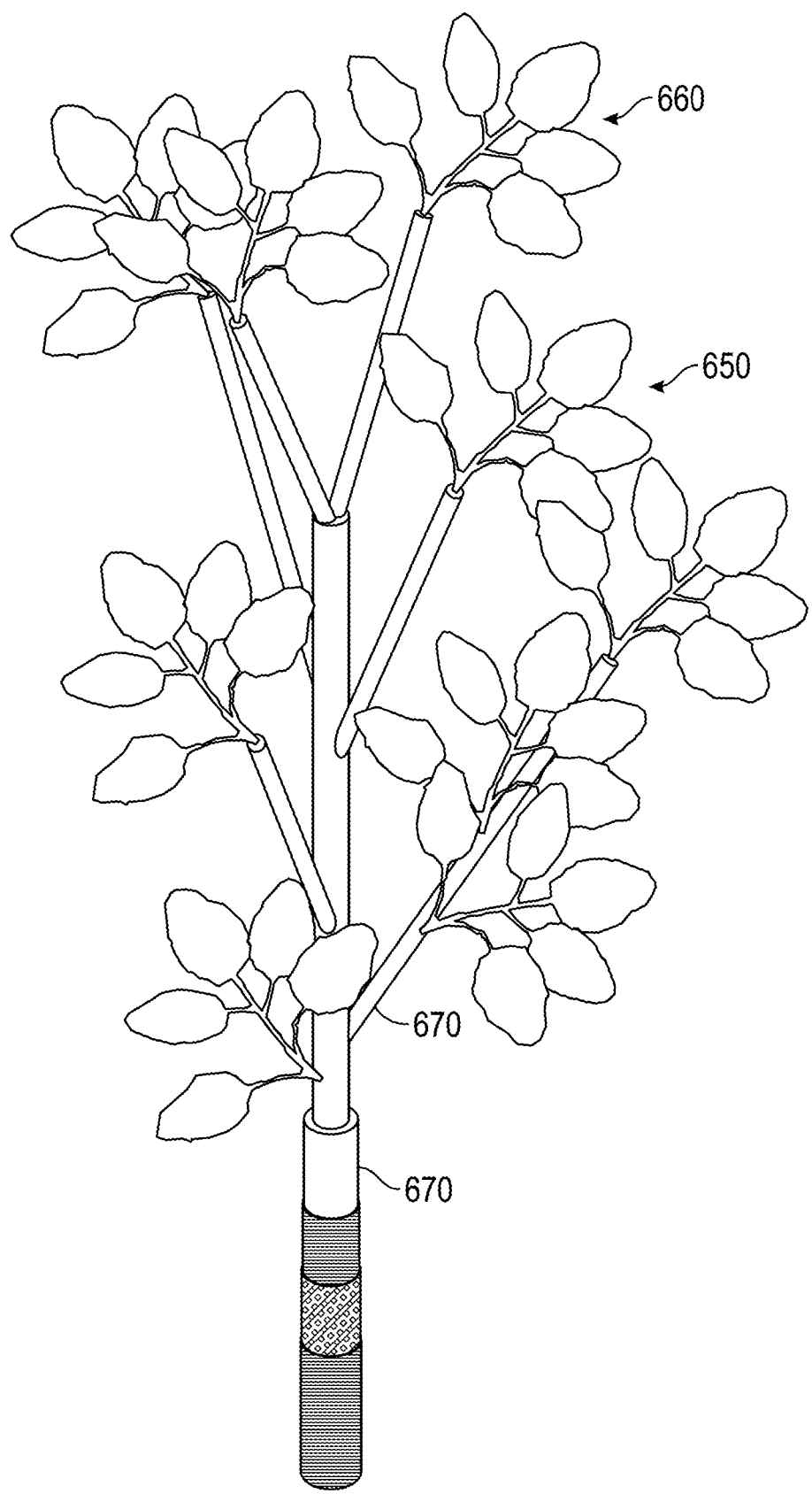
FIG. 14 is a front-elevational view of the fire-retardant eucalyptus branch of FIG. 13, but with additional foliage shown

FIGS. 13 and 14 illustrate an embodiment of a fire-retardant eucalyptus branch 650 without and with foliage 660 shown. The branch 650 is used to conceal one or more RF antennas, and includes a plurality of connected PVC pipes 670. The fire retardant antenna screening composite 600 is wrapped around al pipes 670, but not the foliage 660, as a fire-retardant laminate.

Figure 15:
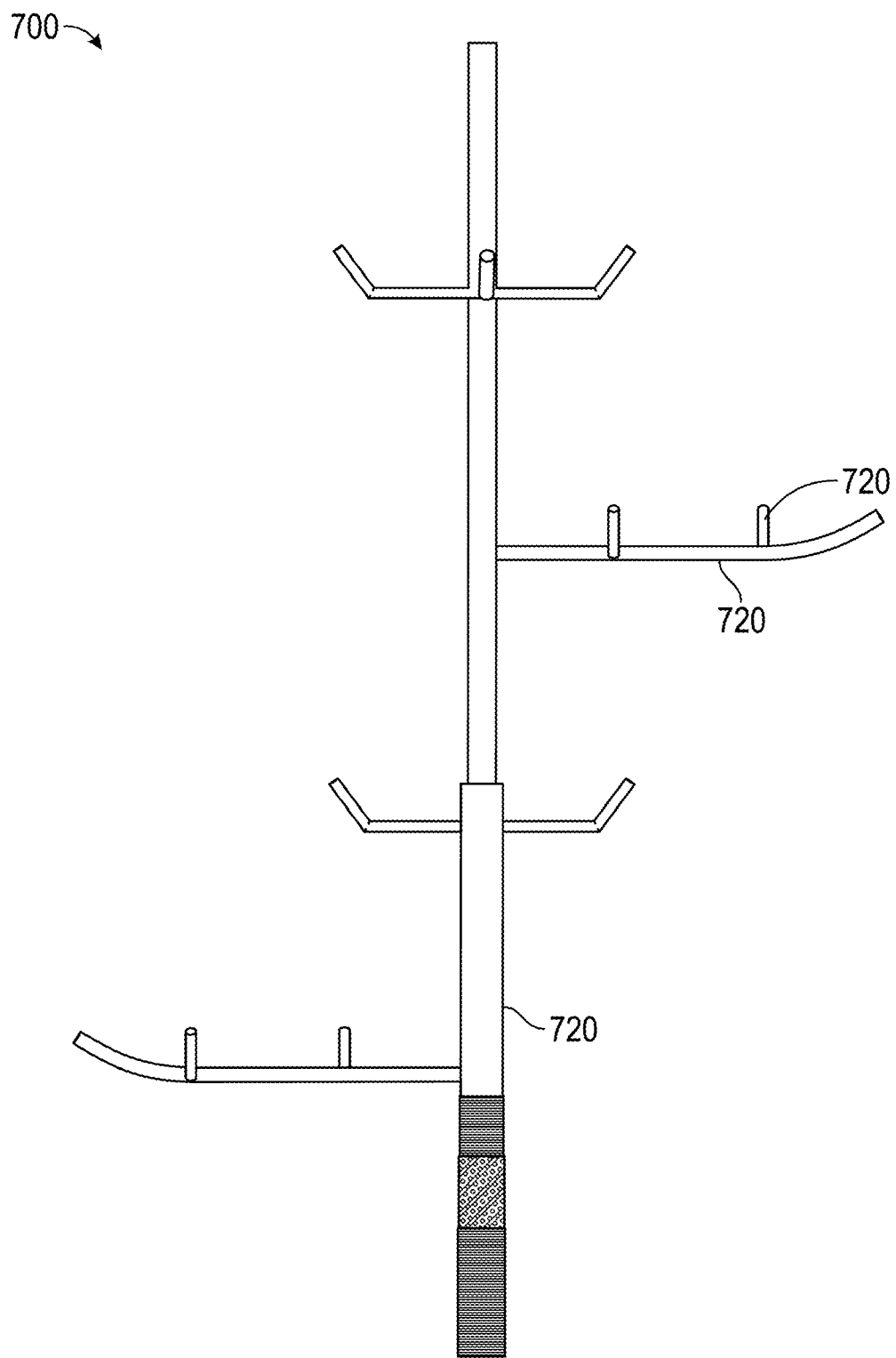
FIG. 15 is a front-elevational view of an embodiment of a fire-retardant pine branch used to conceal one or more RF antennas.
Figure 16:
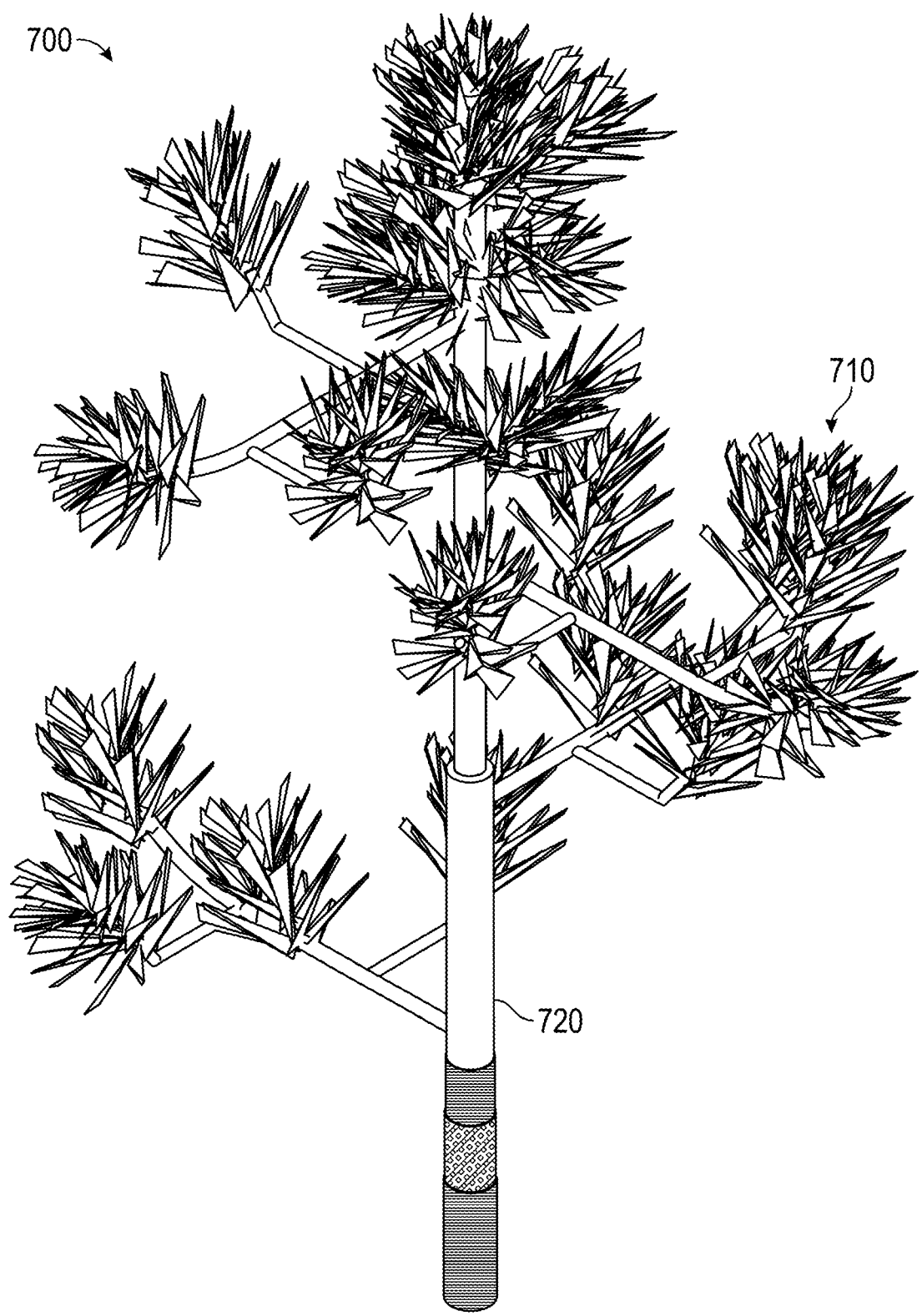
FIG. 16 is a front-elevational view of the fire-retardant pine branch of FIG. 15, but with additional foliage shown.

FIGS. 15 and 16 illustrate an embodiment of a fire-retardant pine branch 700 without and with foliage 710 shown. The branch 700 is used to conceal one or more RF antennas, and includes a plurality of connected PVC pipes 720. The fire retardant antenna screening composite 600 is wrapped around al pipes 720, but not the foliage 710, as a fire-retardant laminate in a manner similar to that described above for eucalyptus branch 650.

In alternative embodiments, the Coremat® BPFM 610 is not included in the fire-retardant laminate for the pipes 670 and/or pipes 720. For example, the laminate may be comprised of the antenna screening panel/composite 400, which does not include the Coremat® BPFM 610.

Further, in alternative embodiments, the Coremat® BPFM 610 is included in one or more of the RF transparent antenna screening panels 120, 220, 300, 400.

An exemplary method of making the antenna screening panels includes blending the fire retardant resin, which is comprised of 36 pounds AOC K140-MTI-00, 42 grams Cobalt 12%, and 242 grams MEKP9 and comes in the following three sub components, which are blended together: 1) resin base, 2) promoter, and 3) methyl ethyl ketone peroxide (MEKP9). This resin has a high boron content, giving it the required refractory properties. After promoting and canalization it is used in layup. The antenna screening panel 400 includes 37.5% glass percentage and 62.5% resin content. The post-cure process for the antenna screening panel/part 400 is performed at 180-210 degrees Fahrenheit (82-98 degrees Celsius), for four hours. The temperature is ramped to 180 degrees Fahrenheit/82 degrees Celsius over 25 minutes without exceeding 5 degrees per minute, where it is held for four hours. The temperature of the part should be taken periodically and the temperature should not exceed 210 degrees Fahrenheit/98 degrees Celsius. After four hours, the oven is shut down and the part is allowed to slowly come back to ambient temperature.

In one or more embodiments of the antenna screening panel assemblies, the material specifications are as follows:
Pultruded Reinforced Plastic: Reinforced plastic formed by the pultrusion method. The minimum properties for the pultrusion beams/antenna structural supports are specified below in Table 1 of Design Values for Fire Retardant Panel ("FRP").

TABLE 1

| Design Values for FRP | | |
|---|---|---|
| Property | Direction | Specification |
| Tensile | Lengthwise | 3750 psi |
|  | Crosswise | 875 psi |
| Tensile Modulus | Lengthwise | $2.5 \times 10^6$ psi |
|  | Crosswise | $0.8 \times 10^6$ psi |

TABLE 1-continued

| Design Values for FRP | | |
|---|---|---|
| Property | Direction | Specification |
| Flexural | Lengthwise | 3750 psi |
|  | Crosswise | 1250 psi |
| Flexural Modulus | Lengthwise | $1.8 \times 10^6$ psi |
|  | Crosswise | $0.8 \times 10^6$ psi |
| Shear | Horizontal | 563 psi |
| Bolt Bearing on FRF | Lengthwise | 3750 psi |
|  | Crosswise | 3750 psi |
| Minimum Edge Distance |  | 1.5 inch |

Front and Rear antenna screening panels 400
Exterior Face: 0.15" thick (1.5 oz fiberglass mat, 3.0 oz fiberglass mat, and 24 oz woven roving with polyester resin between layers)
Urethane Foam Core: 1" thick (4 pcf density)
Interior Face: 0.05" thick (1.5 oz fiberglass mat with polyester resin between layers)
Perimeter Flanges: ¼" thick×4" wide minimum with an alternate 4" wide minimum 90-degree return
⅝" diameter FRP threaded rods
Fiber-reinforced thermoplastic nuts
The antenna screening panel assembly and the FRP Structural shapes are approved plastics with CC1 classification and Flame Spread Index of 20.
The antenna screening panel assembly has an NFPA 268 Certification/ASTM E-84 & ASTM E2768-11 (Extended Duration Surface Burn) with a flame spread index of 25 or less (Flame Spread Index of 20) as determined for an initial 10 min. test period and a flame front that does not progress more than 10.5 ft/3.2 m (test results of 10.3 ft) beyond centerline of burners at any time during 30 min. test period.
The antenna screening panel assembly/panels described herein have received approval from The City of Los Angeles and has met or exceeded the City of Los Angeles' requirements in all categories, and passed the following list of tests completed by a City of Los Angeles approved test facility: NFPA 268-2018, Standard test method for determining ignitability of exterior wall assemblies using a radiant heat energy source; ASTM 0570-98 (reapproved 2010), Standard test method for water absorption of plastics; ASTM 0635-14, Standard test method for rate of burning and/or extent and time of burning of plastics in a horizontal position; ASTM 0638-147, Standard test method for tensile properties of plastics; ASTM 0695-15, Standard test method for compressive properties of rigid plastics; ASTM 01929-16, Standard test method for determining ignition temperature of plastics; ASTM 04475-02 (reapproved 2016), Standard test method for apparent horizontal shear strength of pultruded reinforced plastic rods by short-beam method; ASTM 04476, Standard test method for flexural properties of fiber reinforced pultruded plastic rods; ASTM D44 76M-14, Standard test method for flexural properties of fiber reinforced pultruded plastic rods; ASTM G155-13, Standard practice for operating Xenon Arc Light Apparatus for exposure of non-metallic materials, cycle 1; ASTM E72-15, Standard test method of conduction strength tests of panels for building construction; ASTM E330, Standard test method for structural performance of exterior windows, doors, skylights and curtain walls by Uniform Static Air Pressure Difference; ASTM E330M-14, Standard test method for structural performance of exterior windows, doors, skylights and curtain walls by Uniform Static Air Pressure Difference; ASTM E-84-16, Standard test method for surface burning characteristics of building materials (UL 723, UBC 8-1, NFPA 255); ASTM UL 723, Standard test method for surface burning characteristics of building materials; ASTM UBC 8-1, Standard test method for surface burning characteristics of building materials; ASTM NFPA 255, Standard test method for surface burning characteristics of building material; and ASTM E2768-11, Standard test method for extended duration surface burning characteristics of building materials.

The figures may depict exemplary configurations for the invention, which is done to aid in understanding the features and functionality that can be included in the invention. The invention is not restricted to the illustrated architectures or configurations, but can be implemented using a variety of alternative architectures and configurations. Additionally, although the invention is described above in terms of various exemplary embodiments and implementations, it should be understood that the various features and functionality described in one or more of the individual embodiments with which they are described, but instead can be applied, alone or in some combination, to one or more of the other embodiments of the invention, whether or not such embodiments are described and whether or not such features are presented as being a part of a described embodiment. Thus the breadth and scope of the present invention, especially in the following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

We claim:

1. An antenna screening composite panel, comprising:
one or more fiberglass mats;
one or more layers of Boron-enriched polyester resin;
one or more layers of woven roving; and
one or more layers of one of bonded polyester fiber material and urethane foam,
wherein the antenna screening composite panel includes inner and outer layers each comprising one of the one or more fiberglass mats and one of the one or more layers of Boron-enriched polyester resin, and the one or more layers of one of bonded polyester fiber material and urethane foam are disposed interior to the inner and outer layers, the one or more layers of one of bonded polyester fiber material and urethane foam include a bonded polyester fiber material including a porosity that improves absorption of fire retardant material into the antenna screening composite, and the bonded polyester fiber material includes a resin consumption that is greater than 1.8 kg/m$^2$, 3.3 lbs/sqy and less than 3.0 kg/m$^2$, 5.5 lbs/sqy.

2. The antenna screening composite panel of claim 1, wherein the one or more fiberglass mats include a first fiberglass mat, a second fiberglass mat, and a third fiberglass mat.

3. The antenna screening composite panel of claim 1, wherein the one or more layers of polyester resin include a first layer of polyester resin, a second layer of polyester resin, a third layer of polyester resin, a fourth layer of polyester resin, and a fifth layer of polyester resin.

4. The antenna screening composite panel of claim 1, wherein the one or more layers of woven roving include a single layer of woven roving.

5. The antenna screening composite panel of claim 1, wherein the one or more layers of one of bonded polyester fiber material and urethane foam include one or more layers of urethane foam.

6. The antenna screening composite panel of claim 5, wherein the one or more layers of urethane foam include a single layer of urethane foam.

7. The antenna screening composite panel of claim 1, wherein the bonded polyester fiber material includes a dry weight greater than 110 g/m2, 3.24 oz/sqy and less than 185 g/m2, 5.44 oz/sqy.

8. The antenna screening composite panel of claim 1, wherein the bonded polyester fiber material includes a dry thickness that is greater than 3 mm, 118 mils and less than 5 mm, 197 mils.

9. The antenna screening composite panel of claim 1, wherein the bonded polyester fiber material includes a resin impregnated thickness that is greater than 2.9 mm, 114 mils and less than 4.9 mm, 193 mils.

10. An antenna screening composite panel, comprising:
one or more fiberglass mats;
one or more layers of Boron-enriched polyester resin;
one or more layers of woven roving; and
one or more layers of one of bonded polyester fiber material and urethane foam,
wherein the antenna screening composite panel includes inner and outer layers each comprising one of the one or more fiberglass mats and one of the one or more layers of Boron-enriched polyester resin, and the one or more layers of one of bonded polyester fiber material and urethane foam are disposed interior to the inner and outer layers, the one or more layers of one of bonded polyester fiber material and urethane foam include a bonded polyester fiber material including a porosity that improves absorption of fire retardant material into the antenna screening composite, and the bonded polyester fiber material includes an impregnated specific weight (density) that is less than 0.66 g/cm$^3$, 0.024 lb/in$^3$ and greater than 0.65 g/cm$^3$, 0.023 lb/in$^3$ Y.

11. The antenna screening composite panel of claim 1, wherein the antenna screening composite includes a Flame Spread Index of 20.

12. The antenna screening composite panel of claim 1, wherein the antenna screening composite includes a NFPA 268 Certification/ASTM E-84 & ASTM E2768-11 (Extended Duration Surface Burn) with a flame spread index of 25 or less for a 10 min. period.

13. The antenna screening composite panel of claim 1, wherein the antenna screening composite includes a flame front that does not progress more than 10.5 ft/3.2 m beyond centerline of burners at any time during 30 min. period.

14. A building rooftop communication antenna screening section, comprising:
   a building rooftop with an outer edge;
   one or more antenna screening composite panels disposed along the outer edge of the building rooftop, comprising:
      one or more fiberglass mats;
      one or more layers of Boron-enriched polyester resin;
      one or more layers of woven roving; and
      one or more layers of one of bonded polyester fiber material and urethane foam,
      wherein the one or more antenna screening composite panels each include inner and outer layers each comprising one of the one or more fiberglass mats and one of the one or more layers of Boron-enriched polyester resin, and the one or more layers of one of bonded polyester fiber material and urethane foam are disposed interior to the inner and outer layers, the one or more layers of one of bonded polyester fiber material and urethane foam include a bonded polyester fiber material including a porosity that improves absorption of fire retardant material into the antenna screening composite, and the bonded polyester fiber material includes a resin consumption that is greater than 1.8 kg/m$^2$, 3.3 lbs/sqy and less than 3.0 kg/m$^2$, 5.5 lbs/sqy.

15. A method of making a building rooftop communication antenna screening section on a building rooftop having an outer edge, comprising:
   providing one or more antenna screening composite panels, comprising:
      one or more fiberglass mats;
      one or more layers of Boron-enriched polyester resin;
      one or more layers of woven roving; and
      one or more layers of one of bonded polyester fiber material and urethane foam,
      wherein the one or more antenna screening composite panels each include inner and outer layers each comprising one of the one or more fiberglass mats and one of the one or more layers of Boron-enriched polyester resin, and the one or more layers of one of bonded polyester fiber material and urethane foam are disposed interior to the inner and outer layers, the one or more layers of one of bonded polyester fiber material and urethane foam include a bonded polyester fiber material including a porosity that improves absorption of fire retardant material into the antenna screening composite, and the bonded polyester fiber material includes a resin consumption that is greater than 1.8 kg/m$^2$, 3.3 lbs/sqy and less than 3.0 kg/m$^2$, 5.5 lbs/sqy;
   disposing the one or more antenna screening composite panels along the outer edge of the building rooftop.

16. The method of claim 15, wherein disposing the one or more antenna screening composite panels along the outer edge of the building rooftop includes placing the one or more antenna screening composite panels on a property line of the building rooftop.

17. The method of claim 15, wherein RF antennas are concealed by the one or more antenna screening composite panels and disposed adjacent to the outer edge of the building rooftop, allowing the RF antennas to broadcast RF signals more downward without being blocked by the rooftop adjacent to the outer edge.

* * * * *